US007573334B2

(12) United States Patent
Tantawy

(10) Patent No.: US 7,573,334 B2
(45) Date of Patent: Aug. 11, 2009

(54) BIAS CONTROL CIRCUITRY FOR AMPLIFIERS AND RELATED SYSTEMS AND METHODS OF OPERATION

(75) Inventor: Ramy Salama Tantawy, Pasadena, CA (US)

(73) Assignee: Aptina Imaging Corporation (KY)

( * ) Notice: Subject to any disclaimer, the term of this patent is extended or adjusted under 35 U.S.C. 154(b) by 105 days.

(21) Appl. No.: 11/857,924

(22) Filed: Sep. 19, 2007

(65) Prior Publication Data

US 2009/0072890 A1 Mar. 19, 2009

(51) Int. Cl.
*H03F 3/45* (2006.01)

(52) U.S. Cl. .......................................... 330/261; 330/9

(58) Field of Classification Search ................. 330/261, 330/255, 257, 9

See application file for complete search history.

(56) References Cited

U.S. PATENT DOCUMENTS

| | | | | |
|---|---|---|---|---|
| 4,710,724 | A * | 12/1987 | Connell et al. | 330/9 |
| 5,001,725 | A * | 3/1991 | Senderowicz et al. | 375/247 |
| 5,039,953 | A | 8/1991 | Su | |
| 5,391,999 | A * | 2/1995 | Early et al. | 327/337 |
| 5,798,673 | A | 8/1998 | Griffith et al. | |
| 6,127,891 | A | 10/2000 | Eschauzier et al. | |
| 6,140,877 | A | 10/2000 | Forbes | |
| 6,326,846 | B1 * | 12/2001 | Brandt | 330/253 |
| 6,417,733 | B1 | 7/2002 | Corsi et al. | |
| 6,657,495 | B2 | 12/2003 | Ivanov et al. | |
| 6,965,268 | B2 * | 11/2005 | Dyer et al. | 330/258 |
| 7,064,607 | B2 | 6/2006 | Maclean et al. | |
| 7,078,971 | B2 | 7/2006 | Colbeck | |
| 7,183,850 | B2 * | 2/2007 | Pessl | 330/255 |
| 7,202,739 | B2 | 4/2007 | Forbes et al. | |
| 2007/0052479 | A1 | 3/2007 | Wang | |
| 2007/0096819 | A1 | 5/2007 | Yamamoto et al. | |

OTHER PUBLICATIONS

Hogervorst et al., A Compact Power-Efficient 3 V CMOS Rail-to-Rail Input-Output Operational Amplifier for VLSI Cell Libraries, IEEE Journal of Solid-State Circuits, vol. 29, No. 12, Dec. 1994, pp. 1505-1513.

Langen et al., Compact Low-Voltage Power-Efficient Operation Amplifier Cells for VLSI, IEEE Journal of Solid-State Circuits, vol. 33, No. 10, Oct. 1998, pp. 1482-1496.

* cited by examiner

*Primary Examiner*—Henry K Choe

(57) ABSTRACT

Embodiments of the invention comprise methods, apparatuses and systems for a dynamic bias control circuit configured to dynamically bias an amplifier. The dynamic bias control circuitry includes four branches. Each of the four branches includes a transistor operably coupled in series between a current source and a reference voltage. Each branch also includes a storage element having a first terminal and a second terminal and configured for selectively coupling the first terminal to the reference voltage, selectively coupling the first terminal to a node located between the current source and a drain of the transistor, selectively coupling the second terminal to the node, and selectively coupling the second terminal to an output.

30 Claims, 6 Drawing Sheets

BIAS CONTROL CIRCUITRY FOR AMPLIFIERS AND RELATED SYSTEMS AND METHODS OF OPERATION

FIELD OF THE INVENTION

Embodiments of the present invention relate to operational amplifiers. More particularly, embodiments of the present invention relate to dynamic bias control in CMOS operational amplifiers.

BACKGROUND

In many areas of the electronics industry, electronic circuit designers are turning toward the use of lower supply voltages. This approach enables circuit designers to design electronic systems with smaller power supplies, which may reduce product weight and size.

It is well known in the field of integrated circuits that the design of bias circuitry internal to a chip is essential because it determines the internal voltage and current levels of all operating conditions of the integrated circuit as well as manufacturing process variations. The industry trend for electronic systems encompassing operational amplifiers is also evolving toward lower supply voltages. Thus, amplifiers are used in applications requiring low voltage supply operations in addition to traditionally desired operational amplifier properties such as high input impedance, low input offset voltage, low noise, high bandwidth, high speed, and sufficient output drive capabilities.

Complementary metal oxide semiconductor (CMOS) differential amplifiers are used in both analog and digital circuits. Conventional configurations of CMOS operational amplifiers include a CMOS differential amplifier having a differential input stage followed by an output stage. It is well known in the art for a CMOS operational amplifier to include a CMOS differential input stage and a class AB output stage.

FIG. 1 is a circuit diagram of a conventional CMOS amplifier 100. Amplifier 100 includes a differential input stage 102 and a class AB output stage 108. Input stage 102 includes a positive input terminal 110, a negative input terminal 12, and a current source 114 operably coupled to the source of transistor M31 and the source of transistor M32. Furthermore, input stage 102 includes a summing circuit (transistors M20, M21, and M23-M28) and a floating current source (transistors M29-M30 and transistors M3 and M4 which are connected in a common gate configuration). Output stage 108 includes bias circuit 106 and an amplifier output 120. Amplifier output 120 is operably coupled between the drains of transistors M1 and M2 with the source of transistor M2 operably coupled to a ground voltage Vss. Furthermore, the source of transistor M1 is operably coupled to a voltage supply Vaa.

Bias circuit 106 includes stacked diode-connected transistor branches 140 and 142 that include stacked diode-connected transistors M9 and M8 and stacked diode-connected transistors M5 and M6, respectively. The source of transistor M9 is connected to voltage supply Vaa and the source of transistor M5 is connected to ground voltage Vss. Furthermore, the drains of each transistor M6 and M8 are connected to current sources 118 and 116, respectively. The output transistor quiescent current $I_Q$ is mirrored from the stacked diode-connected transistors M9/M8 and M5/M6 through the common-gate-connected transistors M3 and M4. At a quiescent operating point, complementary currents I1 and I2 are equal and the drains of diode-connected transistor M6 and M8 are used to bias the gates of transistors M4 and M3, respectively.

As configured, conventional CMOS amplifier 100 requires, at a minimum, a supply voltage that is equal to the voltage needed to bias each stacked diode-connected transistor branch 140, 142. Stated another way, in order to bias common-gate-connected transistors M3 and M4, voltage supply Vaa must be at least equal to the gate-to-source voltage drop across two stacked transistors (2Vgs), such as transistors M9 and M8 or transistors M6 and M5. As a result, conventional CMOS amplifier 100 requires a supply voltage that is greater than the minimum supply voltage of conventional output stages within CMOS amplifiers.

There is a need for methods, apparatuses, and systems to decrease the required supply voltage of an operational amplifier. Specifically, there is a need for dynamic bias control circuit to enable low voltage operation of an operational amplifier.

BRIEF DESCRIPTION OF THE DRAWINGS

FIG. 2(*b*) illustrates a representative timing diagram of complimentary clock signals and corresponding voltage levels stored on capacitors within the bias control circuit of FIG. 2(*a*).

FIGS. 3(*c*) and (*d*) are partial circuit diagrams of a second section of the bias control circuit of FIG. 2(*a*), illustrating circuitry pertinent to a charge and an output phase.

DETAILED DESCRIPTION

The present invention, in various embodiments, comprises methods, apparatuses, and systems for an operational amplifier with dynamic bias control circuitry.

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In this description, circuits and functions may be shown in block diagram form in order not to obscure the present invention in unnecessary detail. Furthermore, specific circuit implementations shown and described are only examples and should not be construed as the only way to implement the present invention unless specified otherwise herein. Block definitions and partitioning of logic between various blocks represent a specific implementation. It will be readily apparent to one of ordinary skill in the art that the various embodiments of the present invention may be practiced by numerous other partitioning solutions. For the most part, details concerning timing considerations and the like have been omitted where such details are not necessary to obtain a complete understanding of the present invention in its various embodiments and are within the abilities of persons of ordinary skill in the relevant art.

The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one. Furthermore, in FIGS. 2(*a*), 3(*a*), 3(*b*), 3(*c*), 3(*d*), and 4 described below, positive-channel metal-oxide semiconductor (PMOS) and negative-channel metal-oxide semiconductor (NMOS) transistors are represented schematically by symbols with source electrode arrows pointing respectively toward and away from the transistor gate.

Figure 1:
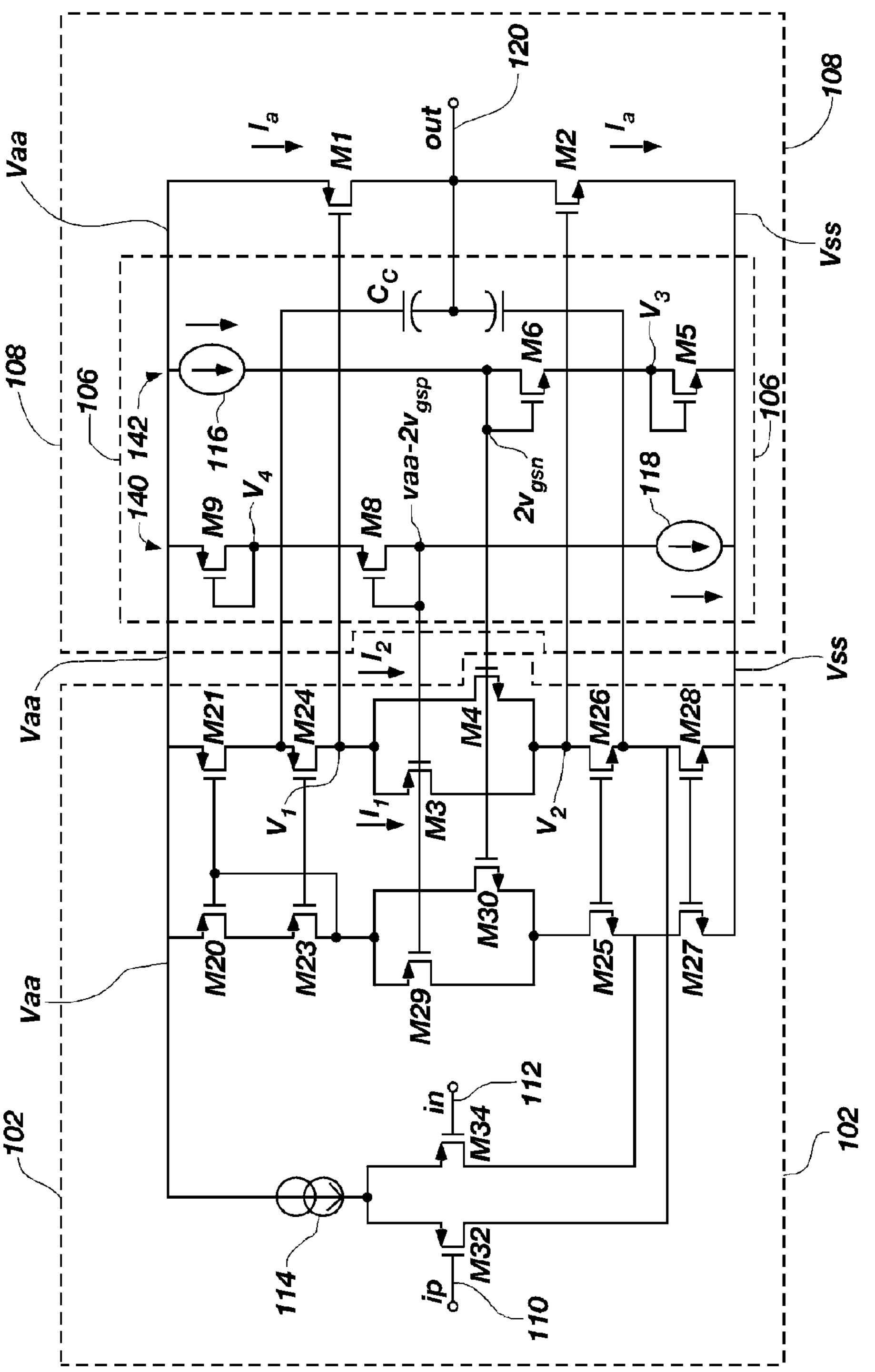
FIG. 1 (PRIOR ART)
FIG. 1 is a circuit diagram of a conventional bias circuit of an operational amplifier.
Figure 2A:
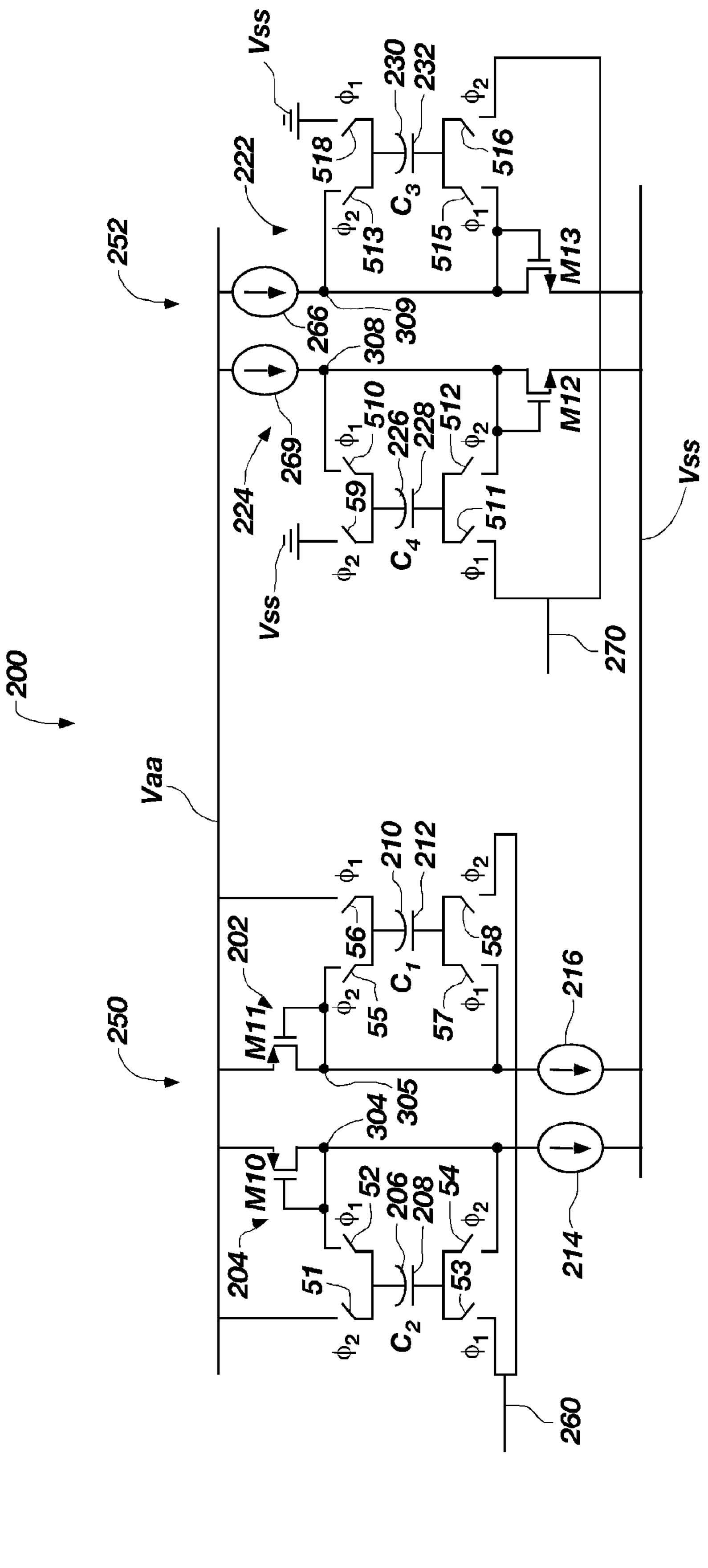
FIG. 2(*a*) is a diagram of a bias control circuit according to an embodiment of the invention.
Figure 2B:
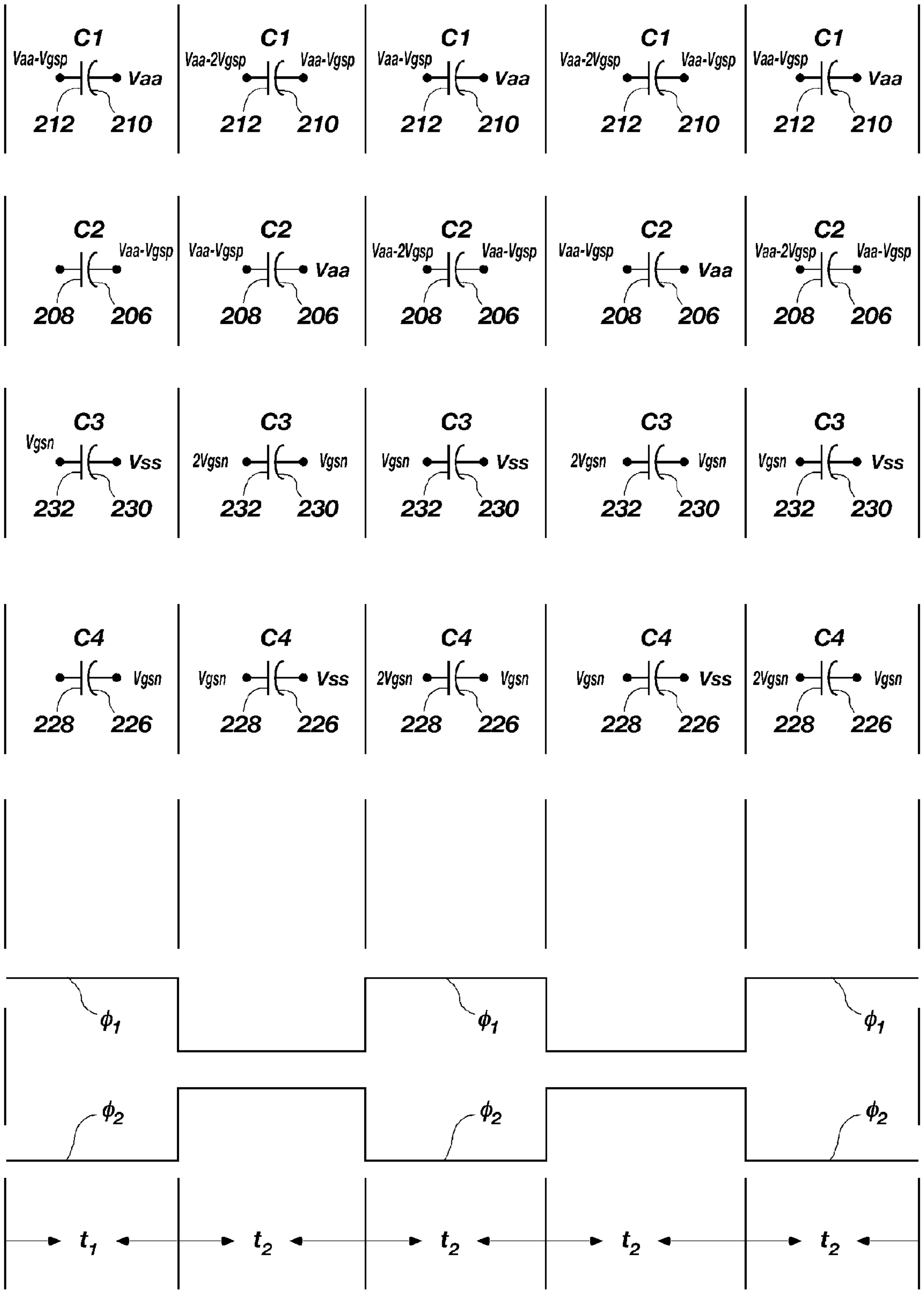
Figures 3A, 3B, 3C, 3D:
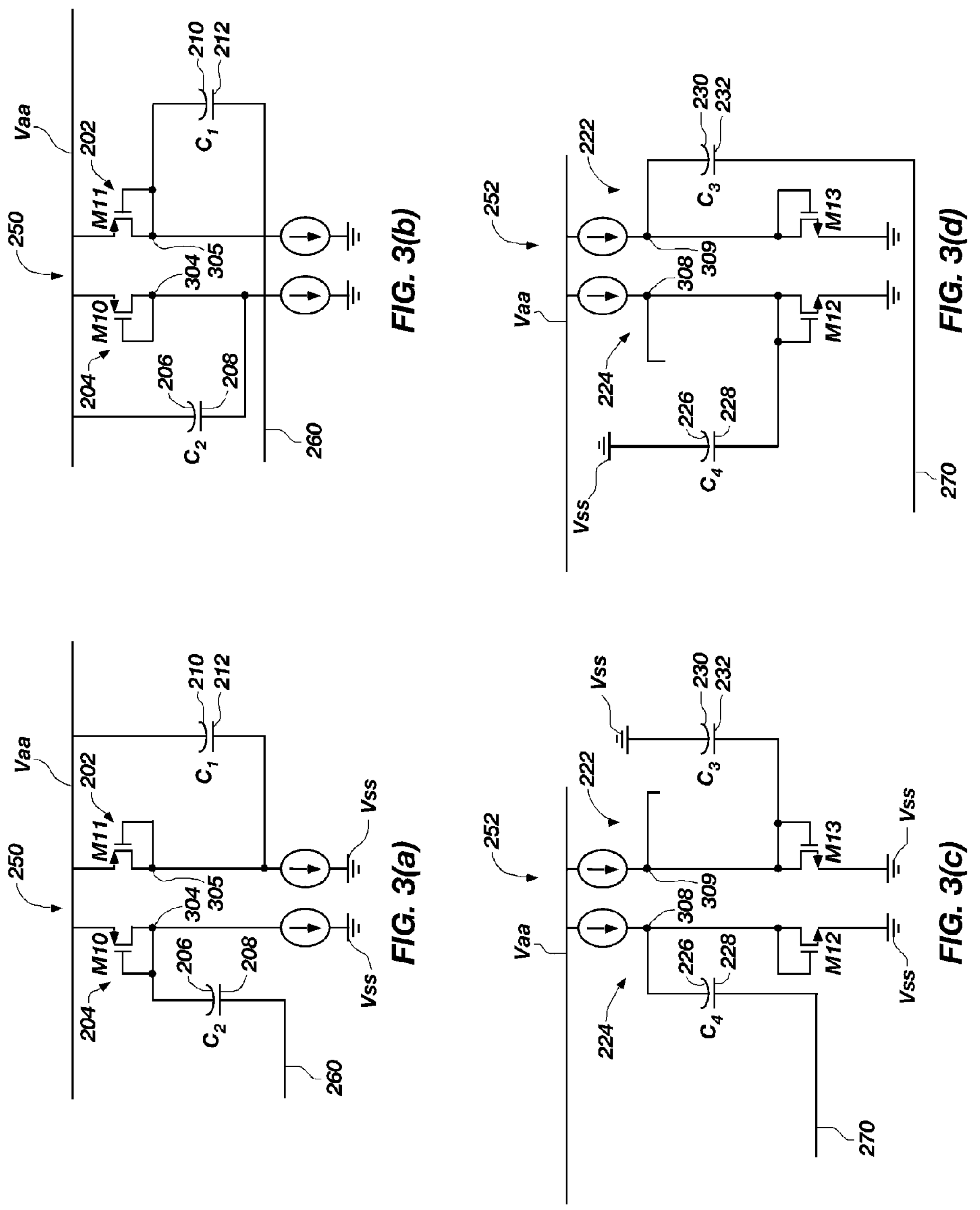
FIGS. 3(*a*) and (*b*) are partial circuit diagrams of a first section of the bias control circuit of FIG. 2(*a*), illustrating circuitry pertinent to a charge and an output phase.
Figure 4:
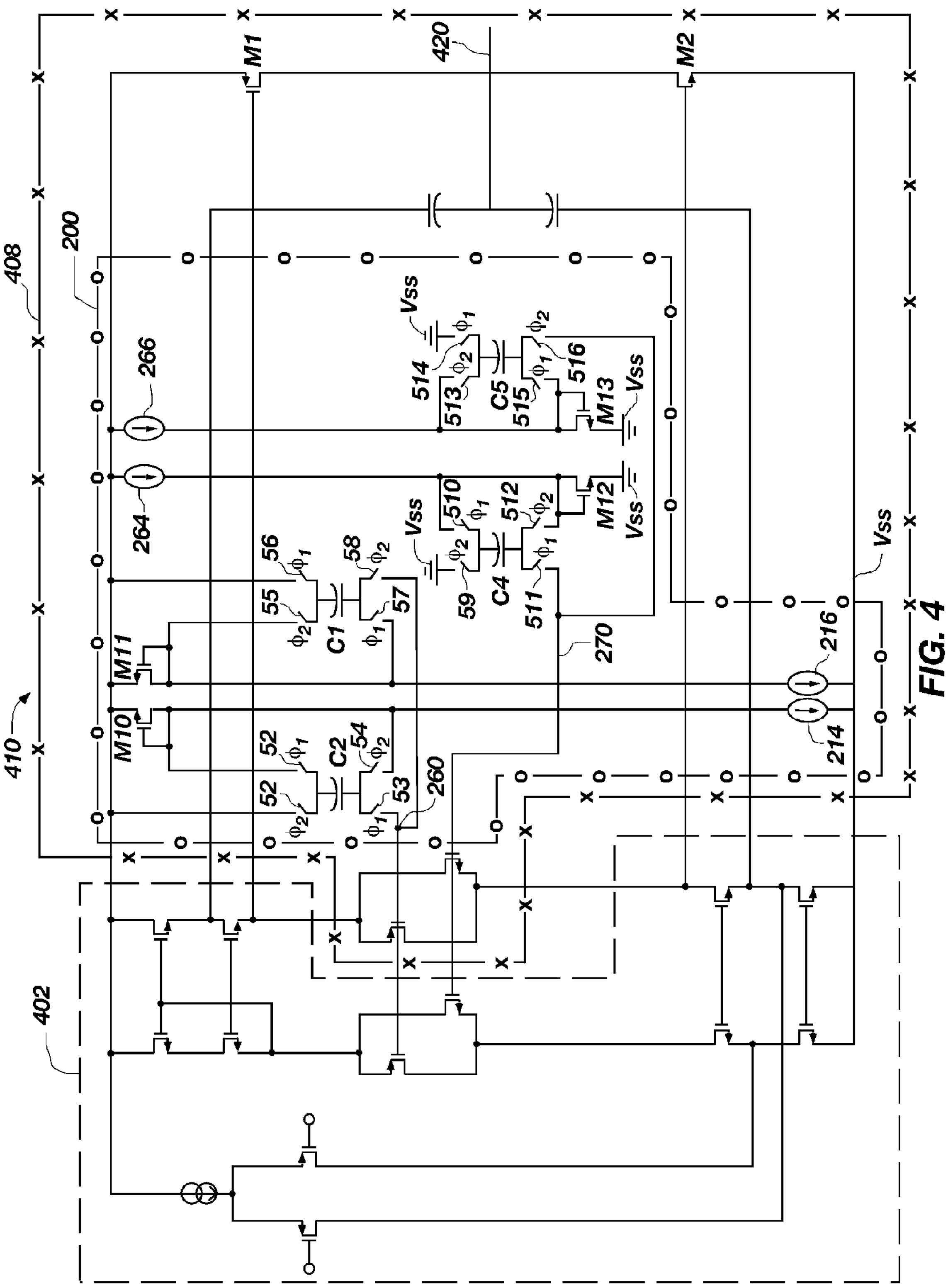
FIG. 4 is a circuit diagram of the bias control circuit implemented within an operational amplifier according to an embodiment of the invention.

FIG. 2(*a*) illustrates a bias control circuit 200 that may be integrated within an operational amplifier for dynamic bias control according to an embodiment of the invention. More specifically, FIG. 2(*a*) illustrates a first section 250 and a second section 252 of bias control circuit 200 that may be used to bias common-gate-connected transistors of an operational amplifier, such as transistors M3 and M4 of an operational amplifier 410 (see FIG. 4). FIG. 2(*b*) illustrates the voltage levels stored on capacitors within bias control circuit 200 corresponding to complementary clock signals Φ1, Φ2 of bias control circuit 200. FIGS. 3(*a*) and (*b*) are partial circuit diagrams of the first section 250 of bias control circuit 200, illustrating circuitry pertinent to the complementary clock signals Φ1, Φ2. FIGS. 3(*c*) and (*d*) are partial circuit diagrams of second section 252 of the bias control circuit 200, illustrating circuitry pertinent to the complementary clock signals Φ1, Φ2. FIG. 4 is a circuit diagram of the bias control circuit 200 integrated within an operational amplifier 410 so as to allow for dynamic bias control.

A contemplated configuration and stand-alone operation of bias control circuit 200 as shown in FIG. 2(*a*) will first be described with reference to FIGS. 2(*a*), 2(*b*), 3(*a*), 3(*b*), 3(*c*), and 3(*d*). Thereafter, a configuration and a contemplated operation of an operational amplifier 410 including bias control circuit 200 will be described in reference to FIG. 4.

Referring to FIG. 2(*a*), bias control circuit 200 may include, for example only, the first section 250 and the second section 252, wherein each section 250, 252 is configured to output a voltage. First section 250 may include a first branch 202 and a second branch 204 and may be configured to provide a bias voltage to a first bias output 260. Additionally, for example only, second section 252 may include a third branch 222 and a fourth branch 224 and may be configured to provide a bias voltage to second bias output 270. First branch 202 may include transistor M11, current source 216, and storage element C1 (may also be referred to as capacitor C1). Storage elements C1, C2, C3, and C4 may each include terminals that may be referred to hereinafter as plates or sides.

By way of example, and not limitation, transistor M11 may comprise a PMOS transistor. The gate and drain of transistor M11 may be operably coupled together and the source of transistor M11 may be operably coupled to a reference voltage, such as voltage supply Vaa. A drain of transistor M11 may be operably coupled to current source 216, which may be operably coupled to another reference voltage, such as ground voltage Vss. Switch S5 may selectively couple a first terminal 210 of storage element C1 to node 305 and to the gate of transistor M11. In addition, first terminal 210 may be selectively coupled to a reference voltage, such as voltage supply Vaa via switch S6. Switch S8 may selectively couple a second terminal 212 of storage element C1 to a first bias output 260. Furthermore, second terminal 212 may be selectively coupled to node 305 via switch S7.

Second branch 204 of first section 250 may include transistor M10, storage element C2 (may also be referred to as capacitor C2), and current source 214. By way of example, and not limitation, transistor M10 may comprise a PMOS transistor. The gate and drain of transistor M10 may be operably coupled together and the source of transistor M10 may be operably coupled to a reference voltage, such as voltage supply Vaa. A drain of transistor M10 may be operably coupled to current source 214, which may be operably coupled to another reference voltage, such as ground voltage Vss. Switch S2 may selectively couple a first terminal 206 of storage element C2 to node 304 and to the gate of transistor M10. Furthermore, first terminal 206 may be selectively coupled to voltage supply Vaa via switch S1. Switch S3 may selectively couple a second terminal 208 of storage element C2 to first bias output 260. Additionally, second terminal 208 may be selectively coupled to node 304 via switch S4.

Third branch 222 of second section 252 may include transistor M13, storage element C3 (may also be referred to as capacitor C3), and current source 266. By way of example, and not limitation, transistor M13 may comprise an NMOS transistor. The gate and drain of transistor M13 may be operably coupled together and the source of transistor M13 may be operably coupled to a reference voltage, such as ground voltage Vss. A drain of transistor M13 may be operably coupled to current source 266, which may be operably coupled to another reference voltage, such as voltage supply Vaa. Switch S13 may selectively couple a first terminal 230 of storage element C3 to node 309. In addition, first terminal 230 may be selectively coupled to ground voltage Vss via switch S14. Switch S16 may selectively couple a second terminal 232 of storage element C3 to a second bias output 270. Moreover, second terminal 232 may be selectively coupled to node 309 and to the gate of transistor M13 via switch 15.

Fourth branch 224 of second section 252 may include transistor M12, storage element C4 (may also be referred to as capacitor C4), and current source 264. By way of example, and not limitation, transistor M112 may comprise an NMOS transistor. The gate and drain of transistor M12 may be operably coupled together and the source of transistor M12 may be operably coupled to a reference voltage, such as ground voltage Vss. A drain of transistor M12 may be operably coupled to current source 264, which may be operably coupled to another reference voltage, such as voltage supply Vaa. Switch S10 may selectively couple a first terminal 226 of storage element C4 to node 308. First terminal 226 may also be selectively coupled to ground voltage Vss via switch S9. Switch S11 may selectively couple a second terminal 228 of storage element C4 to second bias output 270. Additionally, second terminal 228 may be selectively coupled to node 308 and to the gate of transistor M12 via switch S12.

A contemplated operation of first branch 202, second branch 204, third branch 222, and fourth branch 224 of bias control circuit 200 illustrated in FIG. 2(*a*) will now be discussed. Although each branch (202, 204, 222, and 224) may operate simultaneously, for the sake of clarity, the operation of each individual branch will be described separately. Furthermore, for explanation purposes, FIG. 2(*b*) illustrates voltage levels stored on each storage element (C1, C2, C3, and C4) corresponding to complimentary clock signals Φ1, Φ2 which may be asserted or negated during operation.

With reference to FIGS. 2(*a*) and (*b*), during an initial clock cycle, such as clock cycle $t_1$, first branch 202 of first section 250 is in a charge phase wherein signal Φ1 is asserted and signal Φ2 is negated. During the charge phase, switches S6 and S7 are closed, switches S5 and S8 are open, first terminal 210 of a capacitor C1 is charged to voltage supply Vaa, and a second terminal 212 of capacitor C1 is charged to the voltage at node 305. For example only, in an embodiment wherein transistor M11 comprises a PMOS transistor, the voltage at node 305 is the voltage supply minus the gate-to-source voltage drop across a PMOS transistor (Vaa−$V_{gsp}$).

In the next clock cycle, such as clock cycle $t_2$, first branch 202 transitions to an output phase wherein signal Φ1 is negated and signal Φ2 is asserted. Therefore, in the output phase, switches S6 and S7 are open, switches S5 and S8 are closed, and a first terminal 210 of capacitor C1 is charged to the voltage at node 305 (Vaa−$V_{gsp}$). In accordance with the conservation of charge law (i.e., voltage across a capacitor remains substantially constant), as known by one having ordinary skill in the art, as first branch 202 transitions from the charge phase to the output phase and the voltage on first terminal 210 goes from voltage supply Vaa to the voltage at node 305 (Vaa−$V_{gsp}$), the charge on second terminal 212 is forced from (Vaa−$V_{gsp}$) to (Vaa−2$V_{gsp}$).

As shown in FIG. 2(*b*), the operation of first branch 202 during a first clock cycle will be repeated for every alternating clock cycle, such as a third and a fifth clock cycle. Similarly, the operation of first branch 202 during a second clock cycle will be repeated for every alternating clock cycle, such as a fourth and sixth clock cycle. Consequently, starting at a second clock cycle and for each subsequent alternating clock cycle thereafter, first branch 202 may output a voltage equal to (Vaa−2$V_{gsp}$) to first bias output 260. The resulting partial circuit diagrams of first branch 202 during the charge and output phases are shown in FIGS. 3(*a*) and (*b*), respectively.

Referring again to FIGS. 2(*a*) and (*b*), in a second branch 204 during an initial clock cycle, such as clock cycle $t_1$, second branch 204 is in an output phase wherein signal Φ1 is asserted and signal Φ2 is negated. Therefore, switches S2 and S3 are closed, switches S1 and S4 are open, and a first terminal 206 of a capacitor C2 is charged to the voltage at node 304. For example only, in an embodiment wherein transistor M10 comprises a PMOS transistor, the voltage at node 304 is the voltage supply minus the gate-to-source voltage drop across a PMOS transistor (Vaa−$V_{gsp}$). Furthermore, second terminal 208 is operably coupled to first bias output 260. As configured, during an initial clock cycle, second branch 204 is in an output phase without previously being in a charge phase. Therefore, during the initial clock cycle, second terminal 208 does not include a stored voltage and, therefore, second branch 204 will not provide an output to first bias output 260.

In the next clock cycle, such as clock cycle $t_2$, second branch 204 transitions to a charge phase wherein signal Φ2 is asserted and signal Φ1 is negated. As a result, switches S2 and S3 are open, switches S1 and S4 are closed, first terminal 206 of capacitor C2 is charged to voltage supply Vaa, and second terminal 208 of capacitor C2 is charged to the voltage at node 304 (Vaa−$V_{gsp}$).

In the next clock cycle, such as clock cycle $t_3$, second branch 204 transitions to an output phase wherein signal Φ1 is asserted and signal Φ2 is negated. During the output phase, switches S2 and S3 are closed, switches S1 and S4 are open, and first terminal 206 of a capacitor C2 is charged to the voltage at node 304 (Vaa−$V_{gsp}$). In accordance with the conservation of charge law, as known by one having ordinary skill in the art, as second branch 204 transitions from the charge phase to the output phase and the voltage on first terminal 206 goes from voltage supply Vaa to the voltage at node 304 (Vaa−$V_{gsp}$), the charge on second terminal 208 is forced from (Vaa−$V_{gsp}$) to (Vaa−2$V_{gsp}$).

As shown in FIG. 2(*b*), the operation of second branch 204 during a second clock cycle will be repeated for every alternating clock cycle, such as a fourth and a sixth clock cycle. Similarly, the operation of second branch 204 during a third clock cycle will be repeated for every alternating clock cycle, such as a fifth and a seventh clock cycle. Consequently, starting at a third clock cycle and for each subsequent alternating clock cycle thereafter, second branch 204 may output a voltage equal to (Vaa−2$V_{gsp}$) to first bias output 260. The resulting partial circuit diagrams of second branch 204 during the charge and output phases are shown in FIGS. 3(*b*) and (*a*), respectively.

As a result, at any time during circuit operation, first section 250 includes one branch (e.g., 202 or 204) in a charge phase and the other branch (e.g., 204 or 202) in an output phase. Therefore, starting at the second clock cycle and continuing for each subsequent clock cycle, first section 250 may continuously provide a bias voltage equal to (Vaa−2$V_{gsp}$) to first bias output 260.

Referring again to FIGS. 2(*a*), and (*b*), during an initial clock cycle, such as clock cycle $t_1$, third branch 222 is in a charge phase wherein signal Φ1 is asserted and signal Φ2 is negated. During the charge phase, switches 514 and S15 are closed, switches S13 and S16 are open, first terminal 230 of a capacitor C3 is charged to a ground voltage Vss, and a second terminal 232 of capacitor C3 is charged to the voltage at node 309. For example only, in an embodiment wherein transistor M13 comprises an NMOS transistor, the voltage at node 309 is equal to the gate-to-source voltage drop across an NMOS transistor ($V_{gsn}$).

In the next clock cycle, such as clock cycle $t_2$, third branch 222 transitions to an output phase wherein signal Φ2 is asserted and signal Φ1 is negated. During the output phase, switches S14 and S15 are open, switches S13 and 516 are closed, and first terminal 230 of capacitor C3 is charged to the voltage at node 309 ($V_{gsn}$). In accordance with the conservation of charge law, as known by one having ordinary skill in the art, as third branch 222 transitions from the charge phase to the output phase and the voltage on first terminal 230 goes from ground voltage Vss to the voltage at node 309 ($V_{gsn}$), the charge on second terminal 232 is forced from ($V_{gsn}$) to (2$V_{gsn}$).

As shown in FIG. 2(*b*), the operation of third branch 222 during a first clock cycle will be repeated for every alternating clock cycle, such as a third and a fifth clock cycle. Similarly, the operation of third branch 222 during a second clock cycle will be repeated for every alternating clock cycle, such as a fourth and a sixth clock cycle. Consequently, starting at a second clock cycle and for each subsequent alternating clock cycle thereafter, third branch 222 may output a voltage equal to (2$V_{gsn}$) to second bias output 270. The resulting partial circuit diagrams of third branch 222 during the charge and output phases are show in FIGS. 3(*c*) and (*d*), respectively.

Referring again to FIGS. 2(*a*), and (*b*), in the fourth branch 224 during an initial clock cycle, such as clock cycle $t_1$, signal Φ1 is asserted and signal Φ2 is negated. Therefore, switches S10 and S11 are closed, switches S9 and S12 are open, and first terminal 226 of a capacitor C4 is charged to the voltage at node 308. For example only, in an embodiment wherein transistor M12 comprises an NMOS transistor, the voltage at node 308 is equal to the gate-to-source voltage drop across an NMOS transistor ($V_{gsn}$). Furthermore, second terminal 228 is operably coupled to second bias output 270. As configured, during an initial clock cycle, fourth branch 224 is in an output phase without previously being in a charge phase. Therefore, during the initial clock cycle, second terminal 228 does not include a stored voltage and, hence, fourth branch 224 will not provide an output to second bias output 270.

In the next clock cycle, such as clock cycle $t_2$, fourth branch 224 transitions to a charge phase wherein signal Φ2 is asserted and signal Φ1 is negated. As a result, switches S9 and S12 are closed, switches S10 and S11 are open, first terminal 226 of capacitor C4 is charged to ground voltage Vss, and second terminal 228 of capacitor C4 is charged to the voltage at node 308 ($V_{gsn}$).

In the next clock cycle, such as clock cycle $t_3$ fourth branch 224 transitions to an output phase wherein signal Φ1 is asserted and signal Φ2 is negated. During the output phase, switches S10 and S11 are closed, switches S9 and S12 are open, and first terminal 226 of a capacitor C4 is charged to the voltage at node 308 ($V_{gsn}$). In accordance with the conservation of charge law, as known by one having ordinary skill in the art, as fourth branch 224 transitions from the charge phase to the output phase and the voltage on first terminal 226 goes from ground voltage Vss to the voltage at node 308, the charge on second terminal 228 is forced from ($V_{gsn}$) to ($2V_{gsn}$).

As shown in FIG. 2(*b*), the operation of fourth branch 224 during a second clock cycle will be repeated for every alternating clock cycle, such as a fourth and a sixth clock cycle. Similarly, the operation of fourth branch 224 during a third clock cycle wilt be repeated for every alternating clock cycle, such as a fifth and seventh clock cycle. Consequently, starting at a third clock cycle and for each subsequent alternating clock cycle thereafter, fourth branch 224 may output a voltage of ($2V_{gsn}$) to second bias output 270. The resulting partial circuit diagrams of fourth branch 224 during the charge and output phases are shown in FIGS. 3(*d*) and (*c*), respectively.

As a result, at any time during circuit operation, second section 252 includes one branch (e.g., 222 or 224) in a charge phase and the other branch (e.g., 222 or 224) in an output phase. Therefore, starting at a second clock cycle and continuing for each subsequent clock cycle, second section 252 may continuously output a bias voltage equal to ($2V_{gsn}$) to second bias output 270.

FIG. 4 is a circuit diagram of an operational amplifier 410 including bias control circuit 200 according to an embodiment of the invention. Operational amplifier 410 may include a differential input stage 402 and a class AB output stage 408. As known in the art, input stage 402 may include a summing circuit (transistors M20-M28) and a floating current source (transistors M29-M30). Output stage 408 may include common-gate-connected transistors M3 and M4, bias control circuit 200, and an amplifier output 420. Input stage 402 and output stage 408 are only non-limiting examples of contemplated input and output stages of an operational amplifier. As such, various modifications and alternative forms of input stage 402 and output stage 408 are within the scope of the invention.

During operation of operational amplifier 410, starting at a second clock cycle and continuing for each subsequent clock cycle, bias control circuit 200 may continuously provide a bias voltage equal to ($Vaa-2V_{gsp}$) to the gate of transistor M3. Furthermore, starting at a second clock cycle and continuing for each subsequent clock cycle, bias control circuit 200 may continuously provide a bias voltage equal to ($2V_{gsn}$) to the gate of transistor M4.

It will be readily apparent to those of ordinary skill in the art that the switches described herein may be configured and fabricated in a number of ways on a semiconductor device. By way of example, and not limitation, the switches may be formed as NMOS pass gates, PMOS pass gates, or CMOS pass gates.

Figure 5:
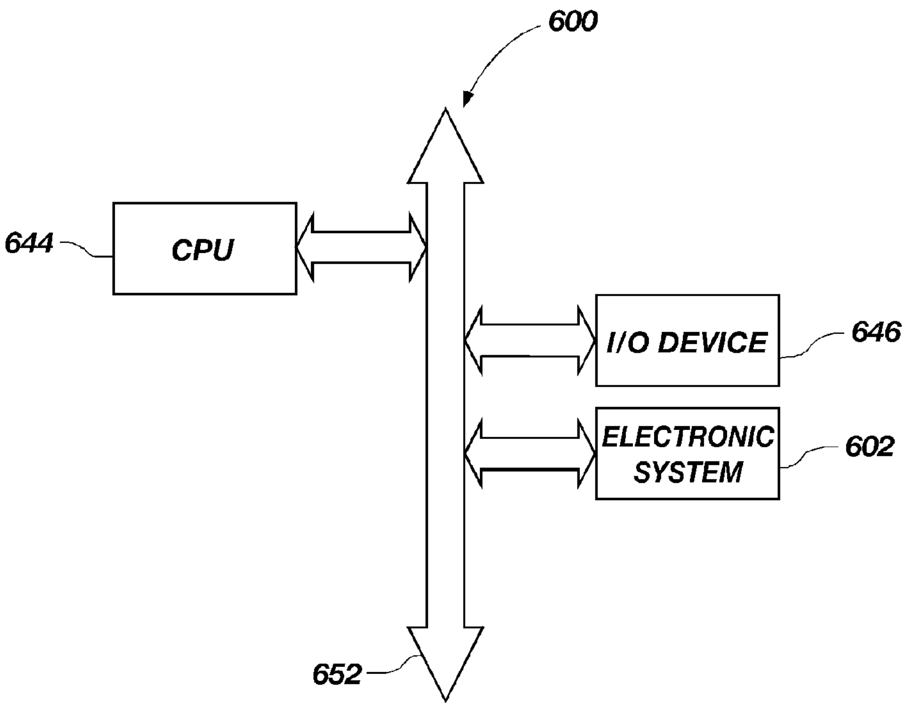
FIG. 5 is a processor-based system including the bias control circuit implemented within an operational amplifier according to an embodiment of the invention.

A processor-based system 600, as illustrated in FIG. 5 may include an electronic system 602 which includes at least one operational amplifier 410 in a component thereof in accordance with an embodiment of the present invention. Processor-based system 600, such as a computer system, for example, generally comprises a central processing unit (CPU) 644, for example, a microprocessor that may communicate with one or more input/output (I/O) devices 646 over a bus 652. Non-limiting examples of I/O devices may include data storage devices, networking devices, data I/O devices (e.g., keyboards, displays, audio/video devices, etc.), etc. Electronic system 600 also includes bias control circuit 200 within operational amplifier 410 (see FIG. 4) as described hereinabove.

Specific embodiments have been shown by way of example in the drawings and have been described in detail herein; however, the various embodiments may be susceptible to various modifications and alternative forms. It should be understood that the invention is not intended to be limited to the particular forms disclosed. Rather, the invention includes all modifications, equivalents, and alternatives falling within the scope of the invention as defined by the following appended claims and their legal equivalents.

What is claimed is:

1. A method of operating a bias control circuit, comprising:

charging a first terminal of at least one storage element to a reference voltage, charging a second terminal of the at least one storage element and a first terminal of at least one other storage element to a voltage level, and operably coupling a second terminal of the at least one other storage element to an output during a clock cycle; and charging the first terminal of the at least one other storage element to the reference voltage, the first terminal of the at least one storage element and the second terminal of the at least one other storage element to the voltage level, and operably coupling the second terminal of the at least one storage element to the output during another clock cycle.

2. The method of claim 1, wherein charging a first terminal of at least one storage element to a reference voltage comprises charging a first terminal of at least one storage element to at least one of a supply voltage and a ground voltage.

3. The method of claim 1, wherein charging the first terminal of the at least one other storage element to a reference voltage comprises charging the first terminal of the at least one other storage element to at least one of a supply voltage and a ground voltage.

4. The method of claim 1, wherein charging a second terminal of the at least one storage element and a first terminal of at least one other storage element to a voltage level comprises charging a second terminal of the at least one storage element and a first terminal of at least one other storage element to at least one of a voltage drop across a transistor (Vgs) and a supply voltage minus a voltage drop across a transistor (Vaa−Vgs).

5. The method of claim 1, wherein charging the first terminal of the at least one storage element and the second terminal of at least one other storage element to a voltage level comprises charging the first terminal of the at least one storage element and the second terminal of at least one other storage element to at least one of a voltage drop across a transistor (Vgs) and a supply voltage minus a voltage drop across a transistor (Vaa−Vgs).

6. The method of claim 1, wherein charging the first terminal of the at least one storage element to the first voltage level forces the second terminal of the at least one storage element to a second voltage level.

7. The method of claim 6, wherein a difference between the second voltage level and the first voltage level is substantially equal to a difference between the first voltage level and the reference voltage.

8. The method of claim 1, wherein charging the first terminal of the at least one other storage element to the first voltage level forces the second terminal of the at least one other storage element to a second voltage level.

9. The method of claim 8, wherein a difference between the second voltage level and the first voltage level is substantially equal to a difference between the first voltage level and the reference voltage.

10. A method of operating a bias control circuit, comprising:

coupling a first terminal of at least one storage element to a reference voltage and coupling a second terminal of the at least one storage element to a voltage node during a charge phase; and coupling the first terminal of the at least one storage element to the voltage node and coupling the second terminal to an output during an output phase.

11. The method of claim 10, wherein coupling a second terminal of the at least one storage element to a voltage node during a charge phase comprise coupling a second terminal of the at least one storage element to a voltage node operably coupled between a current source and a drain of a transistor.

12. The method of claim 10, wherein coupling the first terminal of the at least one storage element to the voltage node during an output phase comprises coupling the first terminal of the at least one storage element to a voltage node operably coupled between a current source and a drain of a transistor.

13. A bias control circuit, comprising:

a plurality of branches, wherein each branch of the plurality comprises:

a transistor operably coupled in series between a current source and a reference voltage; and a storage element having a first terminal and a second terminal and configured for selectively coupling the first terminal to the reference voltage, selectively coupling the first terminal to a node located between the current source and a drain of the transistor, selectively coupling the second terminal to the node and selectively coupling the second terminal to an output.

14. The bias control circuit of claim 13, wherein a source of the transistor is operably coupled to the reference voltage.

15. The bias control circuit of claim 14, wherein the reference voltage comprises at least one of a supply voltage and a ground voltage.

16. The bias control circuit of claim 13, wherein the transistor comprises at least one of a PMOS transistor and an NMOS transistor.

17. The bias control circuit of claim 13, wherein the node is operably coupled to a gate of the transistor.

18. The bias control circuit of claim 13, wherein the drain of the transistor is operably coupled to a gate of the transistor.

19. The bias control circuit of claim 13, wherein the current source is further coupled to another reference voltage.

20. The bias control circuit of claim 19, wherein the another reference voltage comprises at least one of a supply voltage and a ground voltage.

21. The bias control circuit of claim 13, wherein the storage element comprises a capacitor.

22. A bias control circuit, comprising:

a plurality of branches, wherein each branch of the plurality is configured to:

charge a first terminal of a storage element to a reference voltage and a second terminal of the storage element to a first voltage during a charge phase; and charge the first terminal of the storage element to the first voltage and output a second voltage stored on the second terminal of the storage element during an output phase.

23. The bias control circuit of claim 22, wherein the first voltage comprises at least one of a gate-to-source voltage drop across a transistor (Vgs) and a supply voltage minus a gate-to-source voltage drop across a transistor (Vaa−Vgs).

24. The bias control circuit of claim 22, wherein the second voltage comprises at least one of a two gate-to-source voltage drops across a transistor (2Vgs) and a supply voltage minus two gate-to-source voltage drops across a transistor (Vaa−2Vgs).

25. The bias control circuit of claim 22, wherein a difference between the first voltage and the second voltage is substantially equal to a difference between the first voltage and the reference voltage.

26. The bias control circuit of claim 22, wherein during circuit operation at least one branch of the plurality is in the charge phase and at least one branch of the plurality is in the output phase.

27. The bias control circuit of claim 22, wherein the charge phase and the output phase are controlled by complementary clock signals.

28. An operational amplifier, comprising:

an input stage; and an output stage including a bias control circuit, the bias control circuit, comprising:

a plurality of branches, wherein each branch of the plurality comprises:

a transistor operably coupled in series between a current source and a reference voltage; and a capacitor having a first plate and a second plate and adapted to selectively coupling the first plate to the reference voltage, selectively coupling the first plate to a node located between the current source and a drain of the transistor, selectively coupling the second plate to the node and selectively coupling the second plate to an output.

29. The operational amplifier of claim 28, wherein the input stage comprises at least one transistor and the bias circuit is configured to bias the at least one transistor within the input stage.

30. A system, comprising:

at least one processor; and at least one operational amplifier, comprising:

an input stage; and an output stage including a bias control circuit, the bias control circuit, comprising:

a plurality of branches, wherein each branch of the plurality is adapted to:

charge a first side of a capacitor to at least one of a supply voltage and a ground voltage and a second side of the capacitor to a first voltage during a charge phase; and charge the first side of the capacitor to the first voltage and output a second voltage stored on the second side of the capacitor during an output phase.

* * * * *